(12) United States Patent
Pyo et al.

(10) Patent No.: US 10,008,684 B2
(45) Date of Patent: Jun. 26, 2018

(54) ORGANIC LIGHT-EMITTING DEVICE AND DISPLAY APPARATUS INCLUDING THE SAME

(71) Applicant: SAMSUNG DISPLAY CO., LTD., Yongin-si, Gyeonggi-do (KR)

(72) Inventors: Sangwoo Pyo, Hwaseong-si (KR); Jihwan Yoon, Yongin-si (KR); Hyoyeon Kim, Hwaseong-si (KR)

(73) Assignee: SAMSUNG DISPLAY CO., LTD., Yongin-si, Gyeonggi-do, (KR)

( * ) Notice: Subject to any disclaimer, the term of this patent is extended or adjusted under 35 U.S.C. 154(b) by 0 days. days.

(21) Appl. No.: 15/138,601

(22) Filed: Apr. 26, 2016

(65) Prior Publication Data
US 2017/0054101 A1 Feb. 23, 2017

(30) Foreign Application Priority Data
Aug. 18, 2015 (KR) .......................... 10-2015-0116286

(51) Int. Cl.
*H01L 29/08* (2006.01)
*H01L 51/50* (2006.01)
*H01L 51/52* (2006.01)

(52) U.S. Cl.
CPC ...... *H01L 51/5096* (2013.01); *H01L 51/5024* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5228* (2013.01); *H01L 2251/308* (2013.01)

(58) Field of Classification Search
CPC .................................................. H01L 51/5096
USPC ........................................................ 257/40
See application file for complete search history.

(56) References Cited

U.S. PATENT DOCUMENTS

2013/0228755 A1* 9/2013 Cho .................... H01L 51/0053
257/40
2014/0131674 A1* 5/2014 Park .................... H01L 27/3209
257/40

(Continued)

FOREIGN PATENT DOCUMENTS

KR 10-2013-0007308 A 1/2013
KR 10-2013-0100635 A 9/2013

(Continued)

*Primary Examiner* — Ajay K Arora
(74) *Attorney, Agent, or Firm* — Lee & Morse P.C.

(57) ABSTRACT

An organic light-emitting device, including a first sub-organic light-emitting device including a first emission layer, a first common emission part, a first buffer part, a first doping part, and a first cathode part, sequentially stacked; a second sub-organic light-emitting device including a second emission layer, a second common emission part, a second buffer part, a second doping part, and a second cathode part, sequentially stacked; and a third sub-organic light-emitting device including a third common emission part, a third buffer part, a third doping part, and a third cathode part, sequentially stacked, the first through third common emission parts integrated with one another as one body, the first through third buffer parts integrated with one another as one body, the first through third doping parts integrated with one another as one body, and the first through third cathode parts integrated with one another as one body.

17 Claims, 8 Drawing Sheets

(56) References Cited

U.S. PATENT DOCUMENTS

| | | | | |
|---|---|---|---|---|
| 2014/0209874 A1* | 7/2014 | Chun | ................. | H01L 51/5072 257/40 |
| 2015/0014667 A1* | 1/2015 | Li | ...................... | H01L 51/5096 257/40 |
| 2017/0054101 A1 | 2/2017 | Pyo et al. | | |

FOREIGN PATENT DOCUMENTS

| | | |
|---|---|---|
| KR | 10-2014-0087661 A | 7/2014 |
| KR | 10-2017-0021973 A | 3/2017 |

* cited by examiner

ORGANIC LIGHT-EMITTING DEVICE AND DISPLAY APPARATUS INCLUDING THE SAME

CROSS-REFERENCE TO RELATED APPLICATION

Korean Patent Application No. 10-2015-0116286, filed on Aug. 18, 2015, in the Korean Intellectual Property Office, and entitled: "Organic Light-Emitting Device and Display Apparatus Including the Same," is incorporated by reference herein in its entirety.

BACKGROUND

1. Field

The present disclosure herein relates to organic light-emitting devices and display apparatuses including the same.

2. Description of the Related Art

Flat display devices may be broadly classified as an emissive type and a non-emissive type. The emissive type may include a flat cathode ray tube, a plasma display panel, and organic light-emitting display (OLED). An organic light-emitting display may include an organic light-emitting device. An organic light-emitting display may be a self-emissive display, and may have wide viewing angles, excellent contrast, and high response speed.

SUMMARY

Embodiments may be realized by providing an organic light-emitting device, including a first sub-organic light-emitting device including a first anode, a first emission layer, a first common emission part, a first buffer part, a first doping part, and a first cathode part, which are sequentially stacked; a second sub-organic light-emitting device including a second anode, a second emission layer, a second common emission part, a second buffer part, a second doping part, and a second cathode part, which are sequentially stacked; and a third sub-organic light-emitting device including a third anode, a third common emission part, a third buffer part, a third doping part, and a third cathode part, which are sequentially stacked, the first common emission part, the second common emission part, and the third common emission part being integrated with one another as one body, the first buffer part, the second buffer part, and the third buffer part being integrated with one another as one body, the first doping part, the second doping part, and the third doping part being integrated with one another as one body, and the first cathode part, the second cathode part, and the third cathode part being integrated with one another as one body.

The first emission layer may emit light having a wavelength range of about 620 nm to about 750 nm, the second emission layer may emit light having a wavelength range of about 495 nm to about 570 nm, and the first common emission part, the second common emission part, and the third common emission part may emit light having a wavelength range of about 440 nm to about 490 nm.

The first sub-organic light-emitting device may further include a first hole transport region part between the first anode and the first emission layer, the second sub-organic light-emitting device may further include a second hole transport region part between the second anode and the second emission layer, the third sub-organic light-emitting device may further include a third hole transport region part between the third anode and the third common emission part, and the first hole transport region part, the second hole transport region part, and the third hole transport region part may be integrated with one another as one body.

The first sub-organic light-emitting device may further include a first auxiliary layer between the first hole transport region part and the first emission layer.

The second sub-organic light-emitting device may further include a second auxiliary layer between the second hole transport region part and the second emission layer.

The first sub-organic light-emitting device may further include a first electron transport region part on the first doping part, the second sub-organic light-emitting device may further include a second electron transport region part on the second doping part, the third sub-organic light-emitting device may further include a third electron transport region part on the third doping part, and the first electron transport region part, the second electron transport region part, and the third electron transport region part may be integrated with one another as one body.

The first sub-organic light-emitting device, the second sub-organic light-emitting device, and the third sub-organic light-emitting device may be spaced apart from one another.

Embodiments may be realized by providing a display apparatus, including a base substrate divided into a first light-emitting area, a second light-emitting area, and a third light-emitting area, which are spaced apart from one another; a first emission layer in the first light-emitting area; a second emission layer in the second light-emitting area; a common emission layer in the first light-emitting area, the second light-emitting area, and the third light-emitting area, the common emission layer being one body on the first emission layer and the second emission layer; a buffer layer in the first light-emitting area, the second light-emitting area, and the third light-emitting area, the buffer layer being one body on the common emission layer; and a doping layer, at least a portion of the doping layer including an n-type dopant, the doping layer being in the first light-emitting area, the second light-emitting area, and the third light-emitting area, the doping layer being one body on the buffer layer.

The common emission layer may be on an entire area of the base substrate, the buffer layer may be on an entire area of the common emission layer, and the doping layer may be on an entire area of the buffer layer.

The first light-emitting area may emit light having a wavelength range of about 620 nm to about 750 nm, the second light-emitting area may emit light having a wavelength range of about 495 nm to about 570 nm, and the third light-emitting area may emit light having a wavelength range of about 440 nm to about 490 nm.

The first emission layer may emit light having a wavelength range of about 620 nm to about 750 nm, the second emission layer may emit light having a wavelength range of about 495 nm to about 570 nm, and the common emission layer may emit light having a wavelength range of about 440 nm to about 490 nm.

The display apparatus may further include a hole transport region in the first light-emitting area, the second light-emitting area, and the third light-emitting area, the hole transport region being one body between the base substrate and the common emission layer.

The display apparatus may further include a first auxiliary layer in the first light-emitting area, the first auxiliary layer being between the hole transport region and the first emission layer.

The display apparatus may further include a second auxiliary layer in the second light-emitting area, the second auxiliary layer being between the hole transport region and the second emission layer.

The hole transport region may include a hole injection layer on the base substrate; and a hole transport layer on the hole injection layer.

The display apparatus may further include an electron transport region in the first light-emitting area, the second light-emitting area, and the third light-emitting area, the electron transport region being one body on the doping layer.

The electron transport region may include an electron transport layer on the doping layer; and an electron injection layer on the electron transport layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
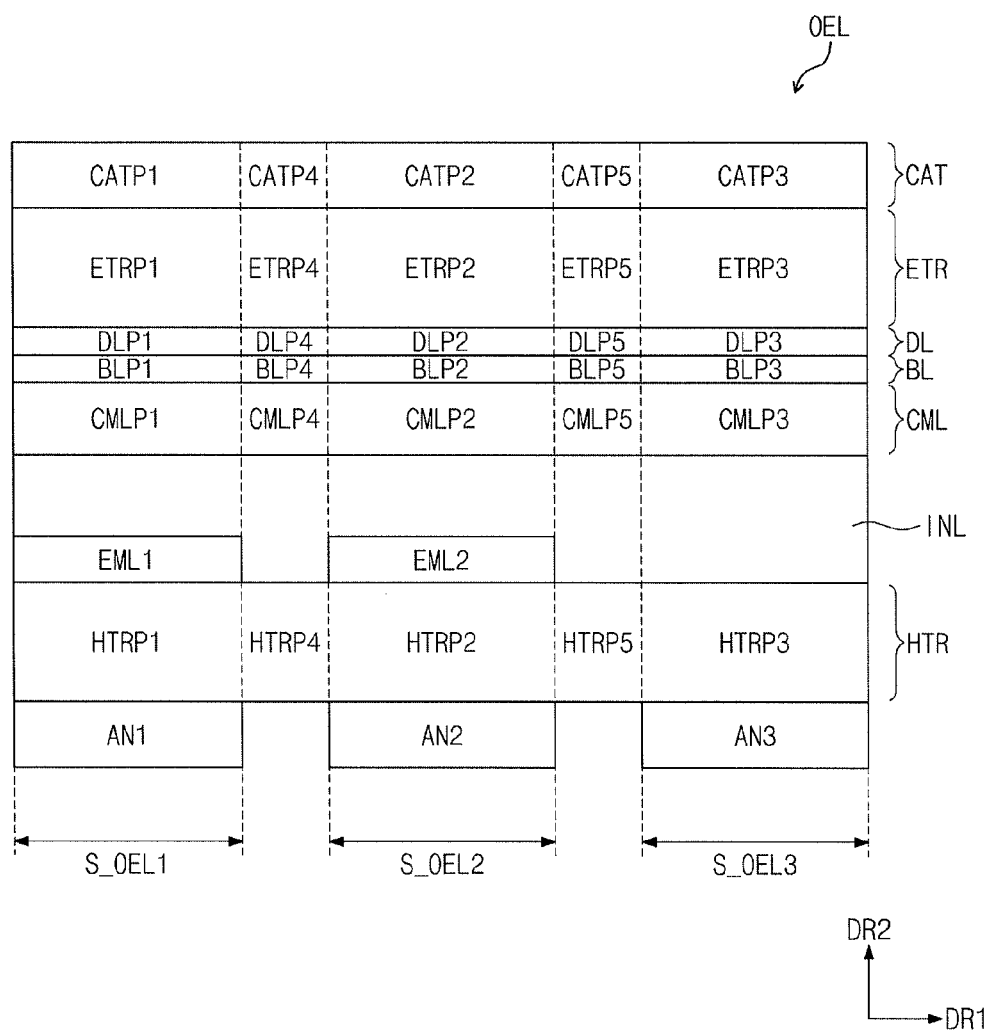
FIG. 1 illustrates a schematic cross-sectional view of an organic light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, like reference numerals refer to like elements throughout. In the accompanying drawings, the dimensions of structures are exaggerated for clarity. It will be understood that although the terms first and second are used herein to describe various elements, these elements should not be limited by these terms. These terms are only used to distinguish one element from another element. For example, a first element could be termed a second element, and, similarly, a second element could be termed a first element. The terms of a singular form may include plural forms unless referred to the contrary.

The meaning of "include," "comprise," "including," or "comprising," specifies a property, a fixed number, a step, a process, an element, a component, or a combination thereof but does not exclude other properties, fixed numbers, steps, processes, elements, components, or combinations thereof. Also, it will be understood that when an element such as a layer, film, region, or substrate is referred to as being "on" another element, it can be directly on the other element or intervening elements may also be present therebetween. In contrast, when an element such as a layer, film, region, or substrate is referred to as being "under" another element, it may be directly under the other element or intervening elements may also be present. In addition, it will also be understood that when a layer is referred to as being "between" two layers, it can be the only layer between the two layers, or one or more intervening layers may also be present.

Hereinafter, an organic light-emitting device according to an embodiment will be described.

Figure 2:
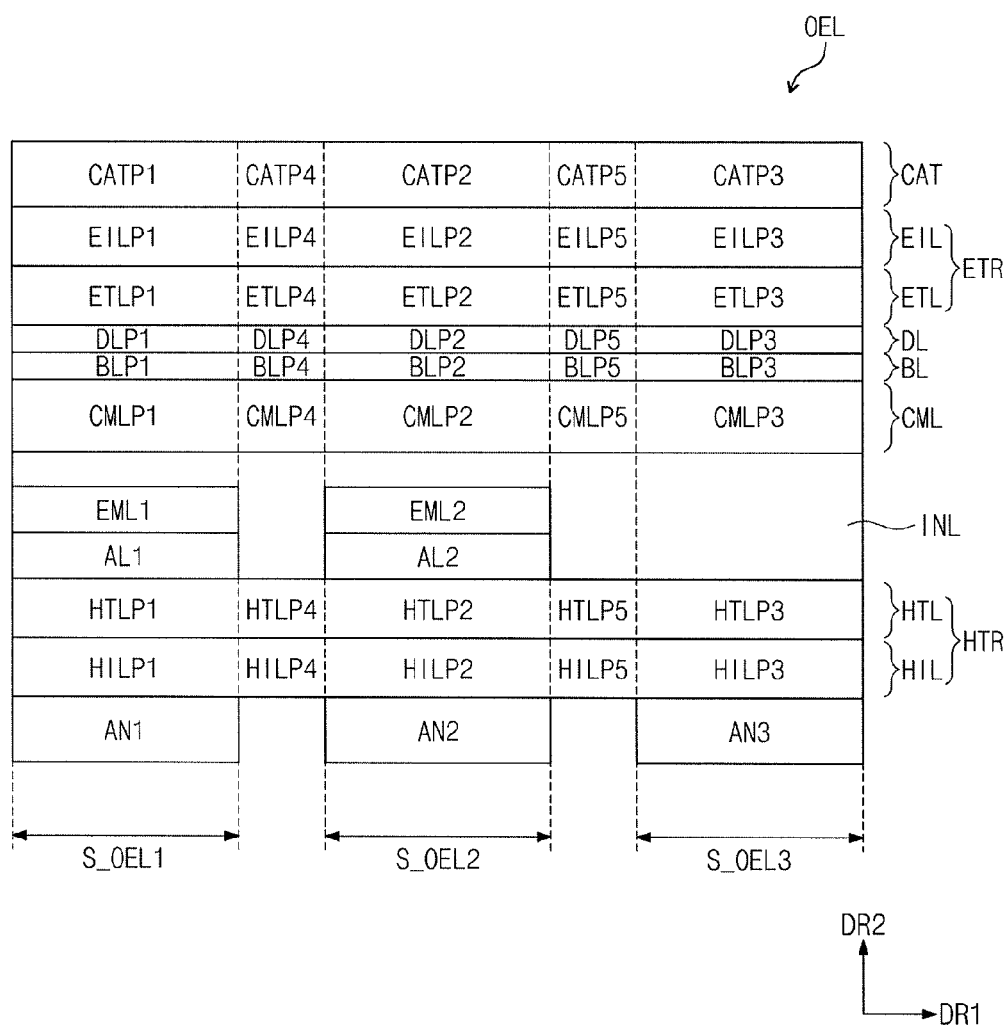
FIG. 2 illustrates a schematic cross-sectional view of an organic light-emitting device according to an embodiment.

FIG. 1 illustrates a schematic cross-sectional view of an organic light-emitting device according to an embodiment. FIG. 2 illustrates a schematic cross-sectional view of an organic light-emitting device according to an embodiment.

Referring to FIGS. 1 and 2, an organic light-emitting device OEL according to an embodiment may include a first sub-organic light-emitting device S_OEL1, a second sub-organic light-emitting device S_OEL2, and a third sub-organic light-emitting device S_OEL3. On a cross-section, the first sub-organic light-emitting device S_OEL1, the second sub-organic light-emitting device S_OEL2, and the third sub-organic light-emitting device S_OEL3 may be provided by being spaced apart in a first direction DR1.

The first sub-organic light-emitting device S_OEL1 may emit light having a wavelength range of about 620 nm to about 750 nm. The first sub-organic light-emitting device S_OEL1 may emit red light. The first sub-organic light-emitting device S_OEL1 may include a first anode AN1, a first emission layer EML1, a first common emission part CMLP1, a first buffer part BLP1, a first doping part DLP1, and a first cathode part CATP1, which may be sequentially stacked in a second direction DR2 crossing the first direction DR1.

The second sub-organic light-emitting device S_OEL2 may emit light having a wavelength range of about 495 nm to about 570 nm. The second sub-organic light-emitting device S_OEL2 may emit green light. The second sub-organic light-emitting device S_OEL2 may include a second anode AN2, a second emission layer EML2, a second common emission part CMLP2, a second buffer part BLP2, a second doping part DLP2, and a second cathode part CATP2, which may be sequentially stacked in the second direction DR2.

The third sub-organic light-emitting device S_OEL3 may emit light having a wavelength range of about 440 nm to about 490 nm. The third sub-organic light-emitting device S_OEL3 may emit blue light. The third sub-organic light-emitting device S_OEL3 may include a third anode AN3, a third common emission part CMLP3, a third buffer part BLP3, a third doping part DLP3, and a third cathode part CATP3, which may be sequentially stacked in the second direction DR2.

The first anode AN1, second anode AN2, and third anode AN3 may be provided by being spaced apart from one another on a cross-section. The first anode AN1, second anode AN2, and third anode AN3 may be provided by being spaced apart in the first direction DR1. The first anode AN1, second anode AN2, and third anode AN3 may be transmissive electrodes, transflective electrodes, or reflective electrodes. In a case in which each of the first anode AN1, second anode AN2, and third anode AN3 is a transmissive electrode, each of the first anode AN1, second anode AN2, and third anode AN3 may be formed of a transparent metal oxide, for example, indium tin oxide (ITO), indium zinc oxide (IZO), zinc oxide (ZnO), or indium tin zinc oxide (ITZO). In a case in which each of the first anode AN1, second anode AN2, and third anode AN3 is a transflective electrode or a reflective electrode, each of the first anode AN1, second anode AN2, and third anode AN3 may include silver (Ag), magnesium (Mg), aluminum (Al), platinum (Pt), palladium (Pd), gold (Au), nickel (Ni), neodymium (Nd), iridium (Ir), chromium (Cr), or a mixture of metals.

A hole transport region HTR may be provided on the first anode AN1, second anode AN2, and third anode AN3. The hole transport region HTR may include a hole injection layer HIL and a hole transport layer HTL. The hole injection layer HIL and the hole transport layer HTL may be formed as a single layer. The hole transport layer HTL may further include one or more of a hole buffer layer or an electron blocking layer.

The hole injection layer HIL may include, for example, a phthalocyanine compound such as copper phthalocyanine; N,N'-diphenyl-N,N-bis-[4-(phenyl-mtolyl -amino)-phenyl]-biphenyl-4,4'-diamine (DNTPD), 4,4',4"-tris(3-methylphenylphenylamino)triphenylamine (m-MTDATA), 4,4'4"-tris (N,N -diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), or polyaniline/poly(4-styrenesulfonate) (PANI/PSS).

The hole injection layer HIL may further include a charge generating material for the improvement of conductivity. The charge generating material may be uniformly or nonuniformly dispersed in the hole injection layer HIL. The charge generating material, for example, may be a p-type dopant. At least a portion of the hole injection layer HIL may include a p-type dopant. The p-type dopant may be, for example, a quinone derivative, a metal oxide, or a cyano group-containing compound. Examples of the p-type dopant may include, for example, a quinone derivative, such as tetracyanoquinodimethane (TCNQ) and 2,3,5,6-tetrafluoro-tetracyanoquinodimethane (F4-TCNQ), or a metal oxide such as tungsten oxide and molybdenum oxide.

The hole transport layer HTL may be provided on the hole injection layer HIL. The hole transport layer HTL may include, for example, a carbazole-based derivative, such as N-phenyl carbazole and polyvinyl carbazole, a fluorine-based derivative, a triphenylamine-based derivative, such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine] (TAPC).

The hole transport region HTR may include a first hole transport region part HTRP1, a second hole transport region part HTRP2, a third hole transport region part HTRP3, a fourth hole transport region part HTRP4, and a fifth hole transport region part HTRP5. The first hole transport region part HTRP1, fourth hole transport region part HTRP4, second hole transport region part HTRP2, fifth hole transport region part HTRP5, and third hole transport region part HTRP3 may be sequentially connected in the first direction DR1 and may be integrated with one another as one body. The first hole transport region part HTRP1 may be included in the first sub-organic light-emitting device S_OEL1. The first hole transport region part HTRP1 may overlap the first anode AN1. The second hole transport region part HTRP2 may be included in the second sub-organic light-emitting device S_OEL2. The second hole transport region part HTRP2 may overlap the second anode AN2. The third hole transport region part HTRP3 may be included in the third sub-organic light-emitting device S_OEL3. The third hole transport region part HTRP3 may overlap the third anode AN3. The fourth hole transport region part HTRP4 may be provided between the first hole transport region part HTRP1 and the second hole transport region part HTRP2. The fifth hole transport region part HTRP5 may be provided between the second hole transport region part HTRP2 and the third hole transport region part HTRP3.

The hole injection layer HIL may include a first hole injection part HILP1, a second hole injection part HILP2, a third hole injection part HILP3, a fourth hole injection part HILP4, and a fifth hole injection part HILP5. The first hole injection part HILP1, fourth hole injection part HILP4, second hole injection part HILP2, fifth hole injection part HILP5, and third hole injection part HILP3 may be sequentially connected in the first direction DR1 and may be integrated with one another as one body. The first hole injection part HILP1 may be included in the first sub-organic light-emitting device S_OEL1. The second hole injection part HILP2 may be included in the second sub-organic light-emitting device S_OEL2. The third hole injection part HILP3 may be included in the third sub-organic light-emitting device S_OEL3. The fourth hole injection part HILP4 may be provided between the first hole injection part HILP1 and the second hole injection part HILP2. The fifth hole injection part HILP5 may be provided between the second hole injection part HILP2 and the third hole injection part HILP3.

The hole transport layer HTL may include a first hole transport part HTLP1, a second hole transport part HTLP2, a third hole transport part HTLP3, a fourth hole transport part HTLP4, and a fifth hole transport part HTLP5. The first hole transport part HTLP1, fourth hole transport part HTLP4, second hole transport part HTLP2, fifth hole transport part HTLP5, and third hole transport part HTLP3 may be sequentially connected in the first direction DR1 and may be integrated with one another as one body. The first hole transport part HTLP1 may be included in the first sub-organic light-emitting device S_OEL1. The second hole transport part HTLP2 may be included in the second sub-organic light-emitting device S_OEL2. The third hole transport part HTLP3 may be included in the third sub-organic light-emitting device S_OEL3. The fourth hole transport part HTLP4 may be provided between the first hole transport part HTLP1 and the second hole transport part HTLP2. The fifth hole transport part HTLP5 may be provided between the second hole transport part HTLP2 and the third hole transport part HTLP3.

A first emission layer EML1 and a second emission layer EML2 may be provided on the hole transport region HTR. The first emission layer EML1 and the second emission layer EML2 may be spaced apart from each other in the first direction DR1.

The first emission layer EML1 may be included in the first sub-organic light-emitting device S_OEL1. The first emission layer EML1 may emit light having a wavelength range of about 620 nm to about 750 nm. The first emission layer EML1 may be formed of a material emitting red light and may include a fluorescent material or a phosphorescent material. The first emission layer EML1, for example, may include a fluorescent material including PBD:Eu(DBM)3 (Phen) (tris(dibenzoylmethanato)phenanthoroline europium) or perylene.

The first emission layer EML1 may include a host and a dopant. The host may be a material used in the art, and, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used. For example, a metal complex or an organometallic complex, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), may be used as the dopant.

The second emission layer EML2 may be included in the second sub-organic light-emitting device S_OEL2. The second emission layer EML2 may emit light having a wavelength range of about 495 nm to about 570 nm. The second emission layer EML2 may be formed of a material emitting green light and may include a fluorescent material or a phosphorescent material. The second emission layer EML2, for example, may include a fluorescent material including tris(8-hydroxyquinolino)aluminum (Alq3).

The second emission layer EML2 may include a host and a dopant. The host may be a material used in the art, and, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used. For example, a metal complex or an organometallic complex, such as fac-tris(2-phenylpyridine)iridium (Ir(ppy)3), may be used as the dopant.

Referring to FIG. 2, a first auxiliary layer AL1 and a second auxiliary layer AL2 may be provided on the hole transport region HTR. It has been described as an example in FIG. 2 that a thickness of the first auxiliary layer AL1 and a thickness of the second auxiliary layer AL2 may be the same. In an embodiment, the thickness of the first auxiliary layer AL1 and the thickness of the second auxiliary layer AL2 may be different from each other.

The first auxiliary layer AL1 may be provided between the first hole transport region part HTRP1 and the first emission layer EML1. The first auxiliary layer AL1 may be included in the first sub-organic light-emitting device S_OEL1. The first auxiliary layer AL1 may not be included in the second sub-organic light-emitting device S_OEL2 and the third sub-organic light-emitting device S_OEL3. The first auxiliary layer AL1 may overlap the first anode AN1.

The first auxiliary layer AL1, for example, may assist resonance in the first sub-organic light-emitting device S_OEL1. The first auxiliary layer AL1 may control a resonance distance in the first sub-organic light-emitting device S_OEL1. The first auxiliary layer AL1, for example, may include the same material as the hole transport layer HTL.

The second auxiliary layer AL2 may be provided between the second hole transport region part HTRP2 and the second emission layer EML2. The second auxiliary layer AL2 may be included in the second sub-organic light-emitting device S_OEL2. The second auxiliary layer AL2 may not be included in the first sub-organic light-emitting device S_OEL1 and the third sub-organic light-emitting device S_OEL3. The second auxiliary layer AL2 may overlap the second anode AN2.

The second auxiliary layer AL2, for example, may assist resonance in the second sub-organic light-emitting device S_OEL2. The second auxiliary layer AL2 may control a resonance distance in the second sub-organic light-emitting device S_OEL2. The second auxiliary layer AL2, for example, may include the same material as the hole transport layer HTL.

Referring again to FIGS. 1 and 2, a common emission layer CML may be provided on the first emission layer EML1, the second emission layer EML2, and the hole transport region HTR. The common emission layer CML may emit light having a wavelength range of about 440 nm to about 490 nm. The common emission layer CML may be formed of a material emitting blue light and may include a fluorescent material or a phosphorescent material. The common emission layer CML, for example, may include a fluorescent material including PBD:Eu(DBM)3(Phen) (tris(dibenzoylmethanato)phenanthoroline europium) or perylene.

The common emission layer CML may include a host and a dopant. The host may be a material used in the art, and, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used. For example, a metal complex or an organometallic complex, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), may be used as the dopant.

The common emission layer CML may include the first common emission part CMLP1, the second common emission part CMLP2, the third common emission part CMLP3, a fourth common emission part CMLP4, and a fifth common emission part CMLP5. The first common emission part CMLP1, fourth common emission part CMLP4, second common emission part CMLP2, fifth common emission part CMLP5, and third common emission part CMLP3 may be sequentially connected in the first direction DR1 and may be integrated with one another as one body.

The first common emission part CMLP1 may be included in the first sub-organic light-emitting device S_OEL1. The first common emission part CMLP1 may overlap each of the first anode AN1, the first hole transport region part HTRP1, the first auxiliary layer AL1, and the first emission layer EML1. The second common emission part CMLP2 may be included in the second sub-organic light-emitting device S_OEL2. The second common emission part CMLP2 may overlap each of the second anode AN2, the second hole transport region part HTRP2, the second auxiliary layer AL2, and the second emission layer EML2. The third common emission part CMLP3 may be included in the third sub-organic light-emitting device S_OEL3. The third common emission part CMLP3 may overlap each of the third anode AN3 and the third hole transport region part HTRP3. The fourth common emission part CMLP4 may be provided between the first common emission part CMLP1 and the second common emission part CMLP2. The fifth common emission part CMLP5 may be provided between the second common emission part CMLP2 and the third common emission part CMLP3.

An intermediate connection layer INL may be provided between the first emission layer EML1 and the common emission layer CML, between the second emission layer EML2 and the common emission layer CML, and between the hole transport region HTR and the common emission layer CML. The intermediate connection layer INL may adjust a charge balance between the first emission layer EML1 and the common emission layer CML and a charge balance between the second emission layer EML2 and the common emission layer CML. For example, the common emission layer CML may be provided on the first emission layer EML1 and the second emission layer EML2, and light emitted from the common emission layer CML may affect light emitted from the first emission layer EML1 and light emitted from the second emission layer EML2. The intermediate connection layer INL may adjust the charge balance, and the light emitted from the common emission layer CML may not affect the light emitted from the first emission layer EML1 and the light emitted from the second emission layer EML2. The intermediate connection layer INL, for example, may include one or more a host or a dopant. It has been described as an example in FIGS. 1 and 2 that the organic light-emitting device OEL according to an embodiment may include the intermediate connection layer INL. In an embodiment, the intermediate connection layer INL may be omitted.

A buffer layer BL may be provided on the common emission layer CML. The buffer layer BL may be provided on an entire area of the common emission layer CML. The buffer layer BL may increase a transfer efficiency of electrons which are transferred from an electron transport layer ETL to the common emission layer CML. The buffer layer BL may block the movement of holes from the common emission layer CML to the electron transport layer ETL, and luminous efficiency may be improved by allowing the holes to remain in the common emission layer CML.

The buffer layer BL, for example, may include one or more of 2,9-dimethyl-4,7-diphenyl-1,10-phenanthroline (BCP), or 4,7-diphenyl-1,10-phenanthroline (Bphen).

The buffer layer BL may include a first buffer part BLP1, a second buffer part BLP2, a third buffer part BLP3, a fourth buffer part BLP4, and a fifth buffer part BLP5. The first buffer part BLP1, fourth buffer part BLP4, second buffer part BLP2, fifth buffer part BLP5, and third buffer part BLP3 may be sequentially connected in the first direction DR1 and may be integrated with one another as one body.

The first buffer part BLP1 may be included in the first sub-organic light-emitting device S_OEL1. The first buffer part BLP1 may overlap each of the first anode AN1, the first hole transport region part HTRP1, the first auxiliary layer AL1, the first emission layer EML1, and the first common emission part CMLP1. The second buffer part BLP2 may be included in the second sub-organic light-emitting device S_OEL2. The second buffer part BLP2 may overlap each of the second anode AN2, the second hole transport region part HTRP2, the second auxiliary layer AL2, the second emission layer EML2, and the second common emission part CMLP2. The third buffer part BLP3 may be included in the third sub-organic light-emitting device S_OEL3. The third buffer part BLP3 may overlap each of the third anode AN3, the third hole transport region part HTRP3, and the third common emission part CMLP3. The fourth buffer part BLP4 may be provided between the first buffer part BLP1 and the second buffer part BLP2. The fifth common emission part CMLP5 may be provided between the second buffer part BLP2 and the third buffer part BLP3.

A doping layer DL may be provided on the buffer layer BL. At least a portion of the doping layer DL may include an n-type dopant. The doping layer DL may be provided on an entire area of the buffer layer BL. The doping layer DL may increase the transfer efficiency of electrons which are transferred from the electron transport layer ETL to the common emission layer CML. The doping layer DL may block the movement of holes from the common emission layer CML to the electron transport layer ETL, and luminous efficiency may be improved by allowing the holes to remain in the common emission layer CML.

The doping layer DL may include a first doping part DLP1, a second doping part DLP2, a third doping part DLP3, a fourth doping part DLP4, and a fifth doping part DLP5. The first doping part DLP1, fourth doping part DLP4, second doping part DLP2, fifth doping part DLP5, and third doping part DLP3 may be sequentially connected in the first direction DR1 and may be integrated with one another as one body.

The first doping part DLP1 may be included in the first sub-organic light-emitting device S_OEL1. The first doping part DLP1 may overlap each of the first anode AN1, the first hole transport region part HTRP1, the first auxiliary layer AL1 the first emission layer EML1, the first common emission part CMLP1, and the first buffer part BLP1. The second doping part DLP2 may be included in the second sub-organic light-emitting device S_OEL2. The second doping part DLP2 may overlap each of the second anode AN2, the second hole transport region part HTRP2, the second auxiliary layer AL2, the second emission layer EML2, the second common emission part CMLP2, and the second buffer part BLP2. The third doping part DLP3 may be included in the third sub-organic light-emitting device S_OEL3. The third doping part DLP3 may overlap each of the third anode AN3, the third hole transport region part HTRP3, the third common emission part CMLP3, and the third buffer part BLP3. The fourth doping part DLP4 may be provided between the first doping part DLP1 and the second doping part DLP2. The fifth common emission part CMLP5 may be provided between the second doping part DLP2 and the third doping part DLP3.

An electron transport region ETR may be provided on the doping layer DL. The electron transport region ETR may be provided on an entire area of the doping layer DL. The electron transport region ETR may further include the electron transport layer ETL and an electron injection layer EIL provided on the electron transport layer ETL. In this case, the electron injection layer EIL may be omitted.

The electron transport layer ETL may include, for example, tris(8-hydroxyquinolinato)aluminum (Alq3), 1,3, 5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), and a mixture thereof. A thickness of the electron transport layer ETL may be in a range of about 100 Å to about 1,000 Å, for example, about 150 Å to about 500 Å. In a case in which the thickness of the electron transport layer ETL in maintained in the above-described range, satisfactory electron transport characteristics may be obtained without a substantial increase in driving voltage.

For example, LiF, lithium quinolate (LiQ), $Li_2O$, BaO, NaCl, CsF, a lanthanide metal, such as ytterbium (Yb), or a metal halide, such as RbCl and RbI, may be used as the electron injection layer EIL. The electron injection layer EIL may also be formed of a material in which an electron transport material and an insulating organometallic salt are mixed. The organometallic salt may be a material having an energy band gap of about 4 eV or more. Specific examples of the organometallic salt may be metal acetate, metal benzoate, metal acetoacetate, metal acetylacetonate, or metal stearate. A thickness of the electron injection layer EIL may be in a range of about 1 Å to about 100 Å, for example, about 3 Å to about 90 Å. In a case in which the thickness of the electron injection layer EIL is maintained in the above-described range, satisfactory electron injection characteristics may be obtained without a substantial increase in driving voltage.

The electron transport region ETR may include a first electron transport region part ETRP1, a second electron transport region part ETRP2, a third electron transport region part ETRP3, a fourth electron transport region part ETRP4, and a fifth electron transport region part ETRP5. The first electron transport region part ETRP1, fourth electron transport region part ETRP4, second electron transport region part ETRP2, fifth electron transport region part ETRP5, and third electron transport region part ETRP3 may be sequentially connected in the first direction DR1 and may be integrated with one another as one body.

The first electron transport region part ETRP1 may be included in the first sub-organic light-emitting device S_OEL1. The first electron transport region part ETRP1 may overlap each of the first anode AN1, the first hole transport region part HTRP1, the first auxiliary layer AL1, the first emission layer EML1, the first common emission part CMLP1, the first buffer part BLP1, and the first doping part DLP1. The second electron transport region part ETRP2 may be included in the second sub-organic light-emitting device S_OEL2. The second electron transport region part ETRP2 may overlap each of the second anode AN2, the second hole transport region part HTRP2, the second auxiliary layer AL2, the second emission layer EML2, the second common emission part CMLP2, the second buffer part BLP2, and the second doping part DLP2. The third electron transport region part ETRP3 may be included in the third sub-organic light-emitting device S_OEL3. The third electron transport region part ETRP3 may overlap each of the third anode AN3, the third hole transport region part HTRP3, the third common emission part CMLP3, the third buffer part BLP3, and the third doping part DLP3. The fourth electron transport region part ETRP4 may be provided between the first electron transport region part ETRP1 and the second electron transport region part ETRP2. The fifth electron transport region part ETRP5 may be provided between the second electron transport region part ETRP2 and the third electron transport region part ETRP3.

The electron transport layer ETL may include a first electron transport part ETLP1, a second electron transport part ETLP2, a third electron transport part ETLP3, a fourth electron transport part ETLP4, and a fifth electron transport part ETLP5. The first electron transport part ETLP1, fourth electron transport part ETLP4, second electron transport part ETLP2, fifth electron transport part ETLP5, and third electron transport part ETLP3 may be sequentially connected in the first direction DR1 and may be integrated with one another as one body. The first electron transport part ETLP1 may be included in the first sub-organic light-emitting device S_OEL1. The second electron transport part ETLP2 may be included in the second sub-organic light-emitting device S_OEL2. The third electron transport part ETLP3 may be included in the third sub-organic light-emitting device S_OEL3. The fourth electron transport part ETLP4 may be provided between the first electron transport part ETLP1 and the second electron transport part ETLP2. The fifth electron transport part ETLP5 may be provided between the second electron transport part ETLP2 and the third electron transport part ETLP3.

The electron injection layer EIL may include a first electron injection part EILP1, a second electron injection part EILP2, a third electron injection part EILP3, a fourth electron injection part EILP4, and a fifth electron injection part EILP5. The first electron injection part EILP1, fourth electron injection part EILP4, second electron injection part EILP2, fifth electron injection part EILP5, and third electron injection part EILP3 may be sequentially connected in the first direction DR1 and may be integrated with one another as one body. The first electron injection part EILP1 may be included in the first sub-organic light-emitting device S_OEL1. The second electron injection part EILP2 may be included in the second sub-organic light-emitting device S_OEL2. The third electron injection part EILP3 ETRP3 may be included in the third sub-organic light-emitting device S_OEL3. The fourth electron injection part EILP4 may be provided between the first electron injection part EILP1 and the second electron injection part EILP2. The fifth electron injection part EILP5 may be provided between the second electron injection part EILP2 and the third electron injection part EILP3.

A cathode CAT may be provided on the electron transport region ETR. The cathode CAT may be provided on an entire area of the electron transport region ETR. The cathode CAT may be a common electrode or an anode. The cathode CAT may be a transmissive electrode, a transflective electrode, or a reflective electrode. In a case in which the cathode CAT is a transmissive electrode, the cathode CAT may include lithium (Li), calcium (Ca), LiF/Ca, LiF/Al, Al, Mg, BaF, barium (Ba), Ag, or a compound or mixture thereof (e.g., mixture of Ag and Mg).

The cathode CAT may include an auxiliary electrode. The auxiliary electrode may include a layer formed to face the emission layer by depositing any of the foregoing materials, and a transparent metal oxide, for example, indium tin oxide (ITO), indium zinc oxide (IZO), zinc oxide (ZnO), or indium tin zinc oxide (ITZO), on the layer. Alternatively, the auxiliary electrode may include molybdenum (Mo) and titanium (Ti).

In a case in which the cathode CAT is a transflective electrode or a reflective electrode, the cathode CAT may include Ag, Mg, copper (Cu), Al, Pt, Pd, Au, Ni, Nd, Ir, Cr, Li, Ca, LiF/Ca, LiF/Al, Mo, Ti, or a compound or mixture thereof (e.g., mixture of Ag and Mg). Alternatively, the cathode CAT may have a multilayer structure including a reflective layer or a transflective layer formed of the above materials and a transparent conductive layer formed of ITO, IZO, ZnO, or ITZO.

In a case in which the organic light-emitting device OEL is a top emission type, the first anode AN1, the second anode AN2, and the third anode AN3 may be reflective electrodes, and the cathode CAT may be a transmissive electrode or a transflective electrode. In a case in which the organic light-emitting device OEL is a bottom emission type, the first anode AN1, the second anode AN2, and the third anode AN3 may be transmissive electrodes or transflective electrodes, and the cathode CAT may be a reflective electrode.

The cathode CAT may include a first cathode part CATP1, a second cathode part CATP2, a third cathode part CATP3, a fourth cathode part CATP4, and a fifth cathode part CATP5. The first cathode part CATP1, fourth cathode part CATP4, second cathode part CATP2, fifth cathode part CATP5, and third cathode part CATP3 may be sequentially connected in the first direction DR1 and may be integrated with one another as one body.

The first cathode part CATP1 may be included in the first sub-organic light-emitting device S_OEL1. The first cathode part CATP1 may overlap each of the first anode AN1, the first hole transport region part HTRP1, the first auxiliary layer AL1, the first emission layer EML1, the first common emission part CMLP1, the first buffer part BLP1, the first doping part DLP1, and first electron transport region part ETRP1. The second cathode part CATP2 may be included in the second sub-organic light-emitting device S_OEL2. The second cathode part CATP2 may overlap each of the second anode AN2, the second hole transport region part HTRP2, the second auxiliary layer AL2, the second emission layer EML2, the second common emission part CMLP2, the second buffer part BLP2, the second doping part DLP2, and the second electron transport region part ETRP2. The third cathode part CATP3 may be included in the third sub-organic light-emitting device S_OEL3. The third cathode part CATP3 may overlap each of the third anode AN3, the third hole transport region part HTRP3, the third common emission part CMLP3, the third buffer part BLP3, the third doping part DLP3, and the third electron transport region part ETRP3. The fourth cathode part CATP4 may be provided between the first cathode part CATP1 and the second cathode part CATP2. The fifth cathode part CATP5 may be provided between the second cathode part CATP2 and the third cathode part CATP3.

In the organic light-emitting device OEL, voltages may be respectively applied to the first anode AN1, the second anode AN2, the third anode AN3, and the cathode CAT, and holes injected from the first anode AN1, the second anode AN2, and the third anode AN3 may move to the first emission layer EML1, the second emission layer EML2, and the common emission layer CML through the hole transport region HTR and electrons injected from the cathode CAT may move to the first emission layer EML1, the second emission layer EML2, and the common emission layer CML through the electron transport region ETR. The electrons and holes may be recombined in the first emission layer EML1, the second emission layer EML2, and the common emission layer CML, excitons may be formed, and light may be emitted while the excitons drop from an excited state to a ground state.

Moving speed of electrons may be lower than moving speed of holes, and a band gap between the energy band of the hole transport region and the energy band of the first emission layer, second emission layer, and common emission layer and a band gap between the energy band of the first emission layer, second emission layer, and common emission layer and the energy band of the electron transport region may be formed. In an organic light-emitting device, luminous efficiency may be reduced, for example, because probability of electrons encountering holes in the first emission layer, second emission layer, and common emission layer may be low and hole and electron injection into the first emission layer, second emission layer, and common emission layer may not be facilitated.

The organic light-emitting device according to an embodiment may include the buffer layer and the doping layer on the common emission layer, and the organic light-emitting device may reduce the band gap between the energy band of the first emission layer, second emission layer, and common emission layer and the energy band of the electron transport region, and may facilitate the electron injection into the first emission layer, second emission layer, and common emission layer. The organic light-emitting device may prevent the holes from moving from the common emission layer to the electron transport region, the organic light-emitting device may allow the holes to remain in the first emission layer, second emission layer, and common emission layer, and the organic light-emitting device according to an embodiment may promote high efficiency and long lifetime.

Hereinafter, a display apparatus according to an embodiment will be described. Hereinafter, points different from the above-described organic light-emitting device according to an embodiment will be mainly described in detail, and undescribed parts will be appreciated referring to the above-described organic light-emitting device according to an embodiment.

Figure 3:
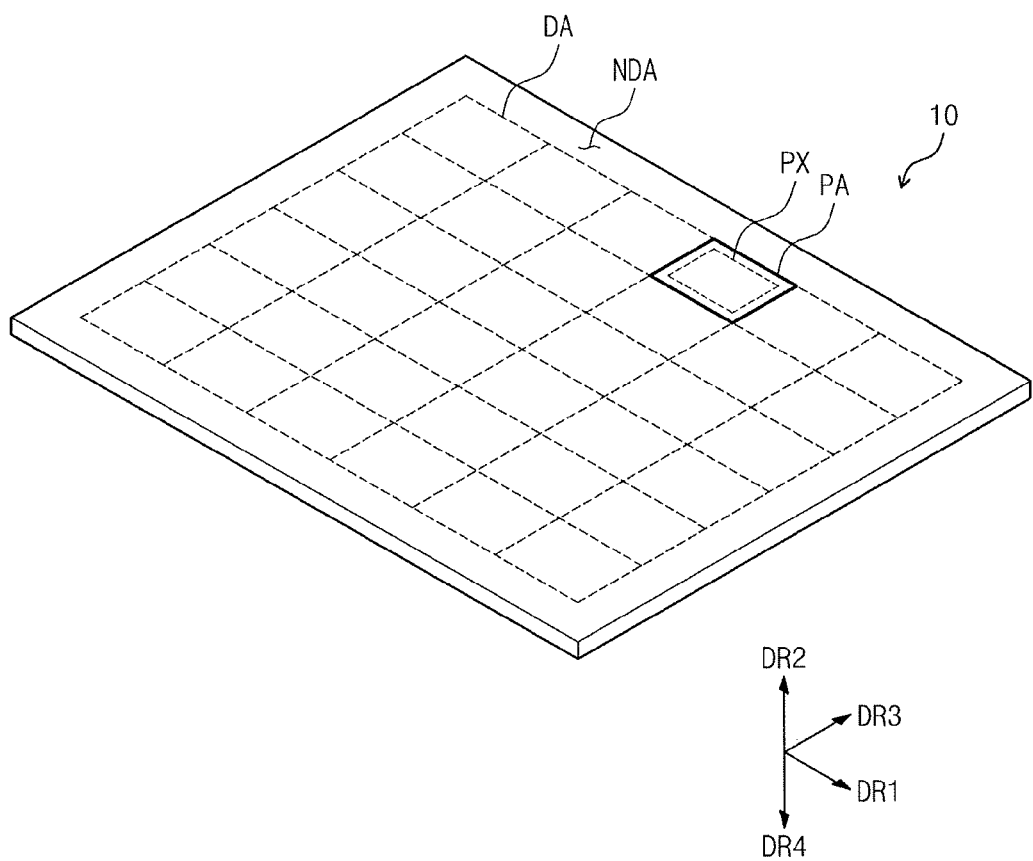
FIG. 3 illustrates a schematic perspective view of a display apparatus according to an embodiment.

FIG. 3 illustrates a schematic perspective view of the display apparatus according to an embodiment.

Referring to FIG. 3, a display apparatus 10 according to an embodiment may be divided into a display area DA and a non-display area NDA. The display area DA may display an image. When viewed from a thickness direction (e.g., DR4) of the display apparatus 10, the display area DA may have, for example, an approximately rectangular shape.

The display area DA may include a plurality of pixel areas PA. The pixel areas PA may be arranged in the form of a matrix. A plurality of pixels PX may be disposed in the pixel areas PA. Each of the pixels PX may include sub-pixels. Each of the pixels PX may include the organic light-emitting device (OEL of FIG. 1). Each of the pixels PX may include a first sub-pixel SPX1, a second sub-pixel SPX2, and a third sub-pixel SPX3.

The non-display area NDA may not display an image. When viewed from the thickness direction DR4 of the display apparatus 10, the non-display area NDA, for example, may surround the display area DA. The non-display area NDA may be adjacent to the display area DA in a first direction DR1 and a third direction D3. The third direction D3 may cross the first direction DR1 and a second direction DR2.

Figure 4:
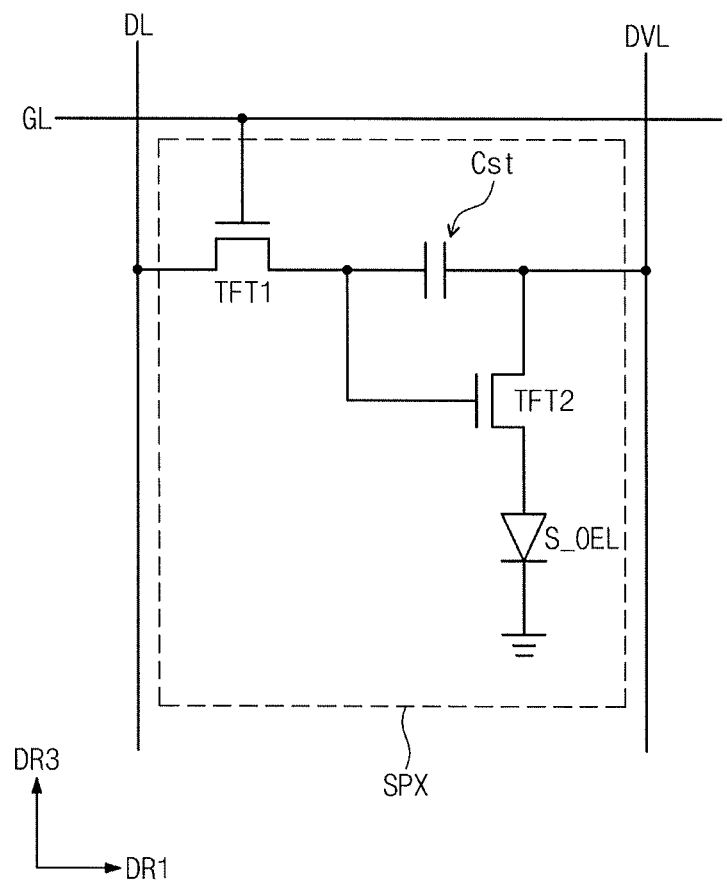
FIG. 4 illustrates a circuit diagram of one of the sub-pixels included in the display apparatus according to an embodiment.
Figure 5:
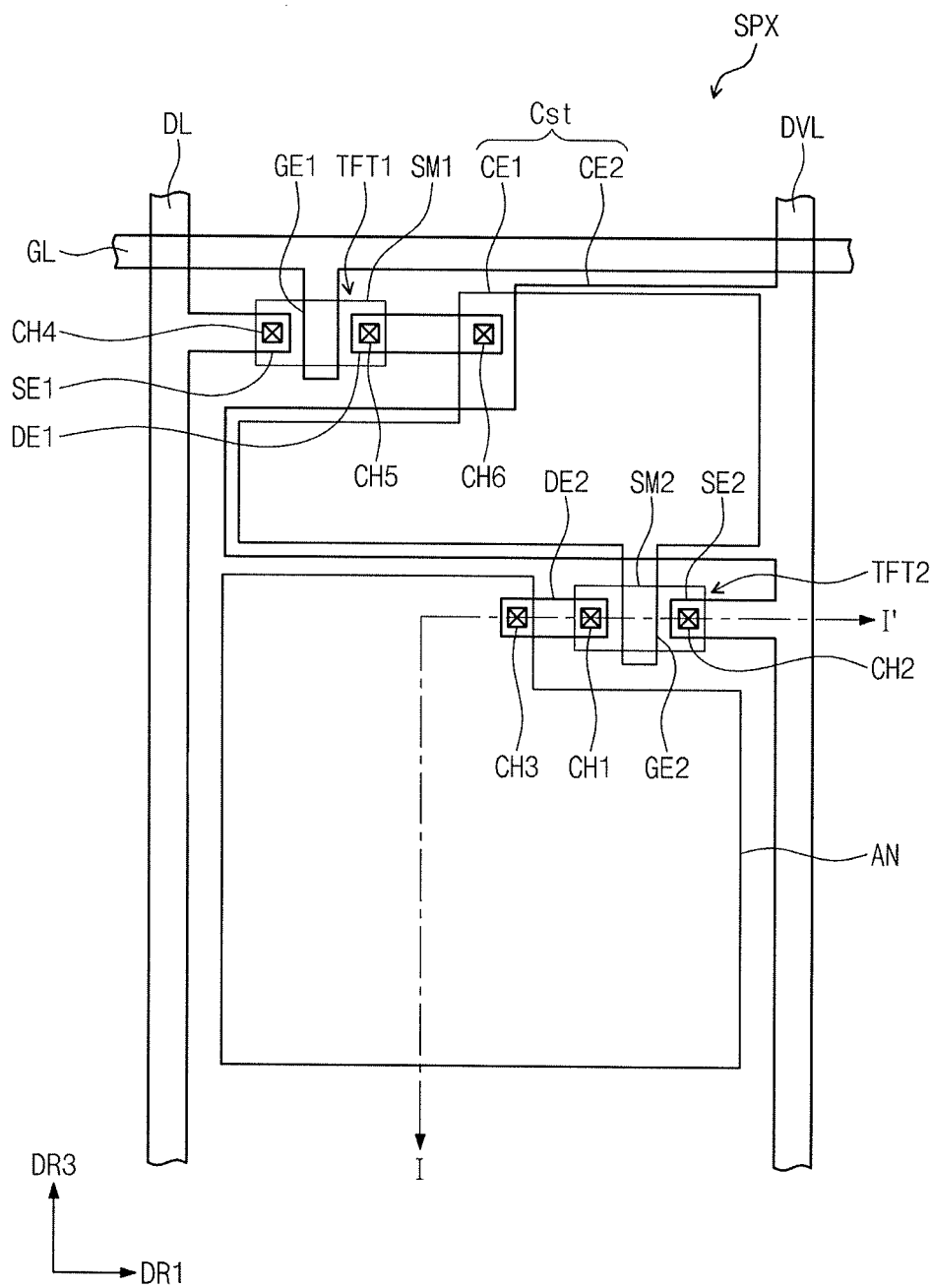
FIG. 5 illustrates a plan view of one of the sub-pixels included in the display apparatus according to an embodiment.
Figure 6:
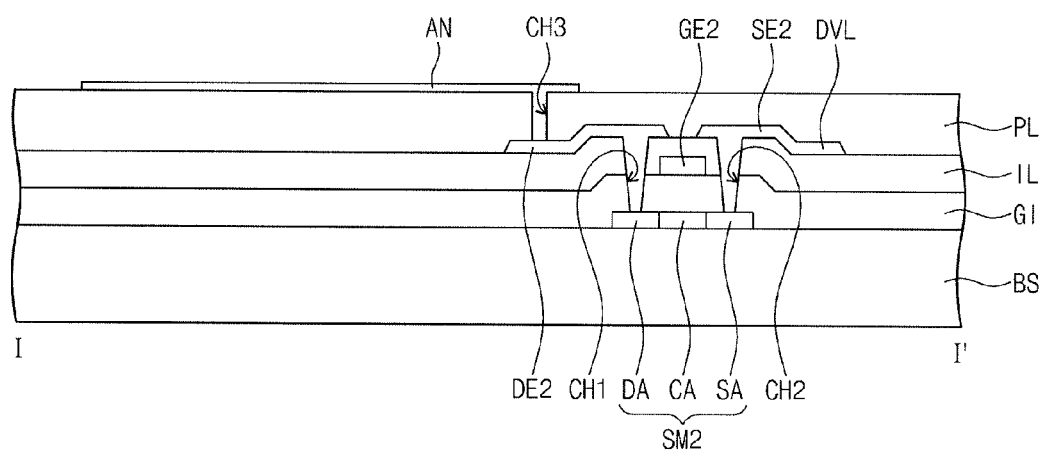
FIG. 6 illustrates a schematic cross-sectional view taken along line I-I' of FIG. 5.

FIG. 4 illustrates a circuit diagram of one of the sub-pixels included in the display apparatus according to an embodiment. FIG. 5 illustrates a plan view of one of the sub-pixels included in the display apparatus according to an embodiment. FIG. 6 illustrates a schematic cross-sectional view taken along line I-I' of FIG. 5.

Referring to FIGS. 4 to 6, each of the sub-pixels SPX may be connected to a wiring unit composed of a gate line GL, a data line DL, and a driving voltage line DVL. Each of the sub-pixels SPX may include thin film transistors TFT1 and TFT2 connected to the wiring unit, a sub-organic light-emitting device S_OEL connected to the thin film transistors TFT1 and TFT2, and a capacitor Cst. Each of the sub-pixels SPX may emit light of a particular color, for example, one of red light, green light, and blue light.

The gate line GL may extend in the first direction DR1. The data line DL may extend in the third direction D3 crossing the gate line GL. The driving voltage line DVL may extend in substantially the same direction as the data line DL, i.e., the third direction DR3. The gate line GL may transmit a scanning signal to the thin film transistors TFT1 and TFT2, the data line DL may transmit a data signal to the thin film transistors TFT1 and TFT2, and the driving voltage line DVL may provide a driving voltage to the thin film transistors TFT1 and TFT2.

The thin film transistors TFT1 and TFT2 may include the driving thin film transistor TFT2 for controlling the sub-organic light-emitting device S_OEL and the switching thin film transistor TFT1 configured to switch the driving thin film transistor TFT2. In an embodiment, each of the sub-pixels SPX may include the two thin film transistors TFT1 and TFT2. In an embodiment, each of the sub-pixels SPX may include one thin film transistor and a capacitor, or each of the sub-pixels SPX may include three or more thin film transistors and two or more capacitors.

The switching thin film transistor TFT1 may include a first gate electrode GE1, a first source electrode SE1, and a first drain electrode DE1. The first gate electrode GE1 may be connected to the gate line GL and the first source electrode SE1 may be connected to the data line DL. The first drain electrode DE1 may be connected to a first common electrode CE1 through a fifth contact hole CH5. The switching thin film transistor TFT1 may transmit the data signal, which may be applied to the data line DL, to the driving thin film transistor TFT2 according to the scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE2 may be connected to the driving voltage line DVL. The second drain electrode DE2 may be connected to an anode AN through a third contact hole CH3.

The capacitor Cst may be connected between the second gate electrode GE2 and the second source electrode SE2 of the driving thin film transistor TFT2, and may charge and maintain the data signal input from the second gate electrode GE2 of the driving thin film transistor TFT2. The capacitor Cst may include the first common electrode CE1, which may be connected to the first drain electrode DE1 through a sixth contact hole CH6, and a second common electrode CE2 which may be connected to the driving voltage line DVL.

The display apparatus 10 according to an embodiment may include a base substrate BS on which the thin film transistors TFT1 and TFT2 and the organic light-emitting device (OEL of FIG. 1) may be stacked. The base substrate BS may be divided into a first light-emitting area EA1, a second light-emitting area EA2, a third light-emitting area EA3, and non-emitting areas NEA1, NEA2, and NEA3.

The base substrate BS, for example, may be formed of an insulating material such as glass, plastic, and quartz. An organic polymer constituting the base substrate BS may include polyethylene terephthalate (PET), polyethylene naphthalate (PEN), polyimide, or polyethersulfone. The base substrate BS may be selected in consideration of mechanical strength, thermal stability, transparency, surface smoothness, ease of handling, or waterproofing properties.

A substrate buffer layer may be provided on the base substrate BS. The substrate buffer layer may prevent the diffusion of impurities into the switching thin film transistor TFT1 and the driving thin film transistor TFT2. The substrate buffer layer may be formed of silicon nitride $SiN_x$, silicon oxide $SiO_x$, and silicon oxynitride ($SiO_xN_y$), and may be omitted depending on the material of the base substrate BS and process conditions.

A first semiconductor layer SM1 and a second semiconductor layer SM2 may be provided on the base substrate BS. The first semiconductor layer SM1 and the second semiconductor layer SM2 may be formed of a semiconductor material and may respectively operate as active layers of the switching thin film transistor TFT1 and the driving thin film transistor TFT2. Each of the first semiconductor layer SM1 and the second semiconductor layer SM2 may include a source region SA, a drain region DA, and a channel region CA provided between the source region SA and the drain region DA. Each of the first semiconductor layer SM1 and the second semiconductor layer SM2 may be formed by being selected from an inorganic semiconductor or an organic semiconductor. The source region SA and the drain region DA may be doped with an n-type impurity or a p-type impurity.

A gate insulating layer GI may be provided on the first semiconductor layer SM1 and the second semiconductor layer SM2. The gate insulating layer GI may cover the first semiconductor layer SM1 and the second semiconductor layer SM2. The gate insulating layer GI may be formed of an organic insulating material or an inorganic insulating material.

The first gate electrode GE1 and the second gate electrode GE2 may be provided on the gate insulating layer GI. The first gate electrode GE1 and the second gate electrode GE2 may be respectively formed to cover regions corresponding to the channel regions CA of the first semiconductor layer SM1 and the second semiconductor layer SM2.

An interlayer dielectric IL may be provided on the first gate electrode GE1 and the second gate electrode GE2. The interlayer dielectric IL may cover the first gate electrode GE1 and the second gate electrode GE2. The interlayer dielectric IL may be formed of an organic insulating material or an inorganic insulating material.

The first source electrode SE1, the first drain electrode DE1, the second source electrode SE2, and the second drain electrode DE2 may be provided on the interlayer dielectric IL. The second drain electrode DE2 is in contact with the drain region DA of the second semiconductor layer SM2 through a first contact hole CH1 formed in the gate insulating layer GI and the interlayer dielectric IL, and the second source electrode SE2 may be in contact with the source region SA of the second semiconductor layer SM2 through a second contact hole CH2 formed in the gate insulating layer GI and the interlayer dielectric IL. The first source electrode SE1 may be in contact with a source region of the first semiconductor layer SM1 through a fourth contact hole CH4 formed in the gate insulating layer GI and the interlayer dielectric IL, and the first drain electrode DE1 SE1 may be in contact with a drain region of the first semiconductor layer SM1 through the fifth contact hole CH5 formed in the gate insulating layer GI and the interlayer dielectric IL.

A passivation layer PL may be provided on the first source electrode SE1 and the first drain electrode DE1, and the second source electrode SE2 and the second drain electrode DE2. The passivation layer PL may function as a protective layer configured to protect the switching thin film transistor TFT1 and the driving thin film transistor TFT2 or may function as a planarization layer configured to planarize top surfaces thereof.

The anode AN may be provided on the passivation layer PL. The anode AN, for example, may be a cathode. The anode AN may be connected to the second drain electrode DE2 of the driving thin film transistor TFT2 through the third contact hole CH3 formed in the passivation layer PL.

Figure 7:
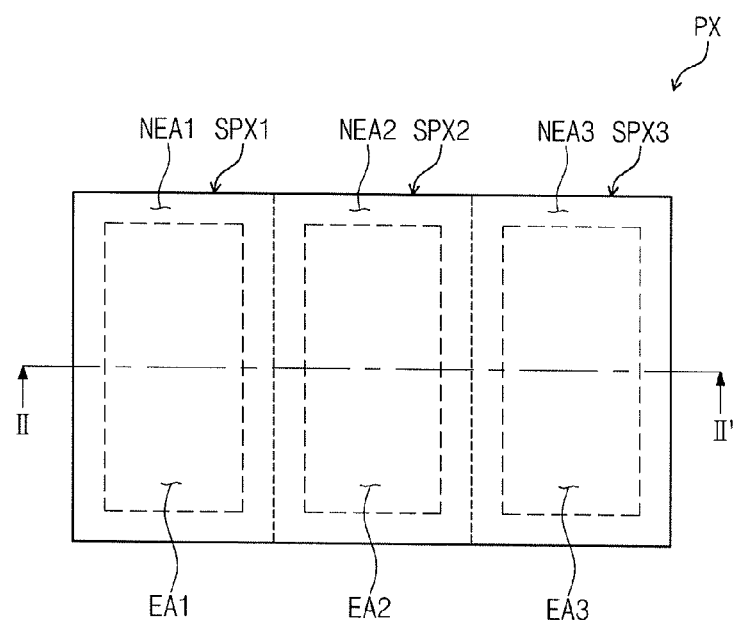
FIG. 7 illustrates a schematic plan view of the sub-pixels included in the display apparatus according to an embodiment.

FIG. 7 illustrates a schematic plan view of the sub-pixels included in the display apparatus according to an embodiment.

Referring to FIGS. 1, 2, 3, and 7, each of the pixels PX may include the sub-pixels SPX. Each of the pixels PX may include the first sub-pixel SPX1, the second sub-pixel SPX2, and the third sub-pixel SPX3. Each of the sub-pixels SPX may be divided into a light-emitting region and a non-emitting region.

In FIG. 7, it has been illustrated as an example that the first sub-pixel SPX1, the second sub-pixel SPX2, and the third sub-pixel SPX3 may be sequentially connected in the first direction DR1 on the plane. In an embodiment, the first sub-pixel SPX1, the second sub-pixel SPX2, and the third sub-pixel SPX3 may be sequentially connected in the third direction DR3 on the plane, or the first sub-pixel SPX1, the third sub-pixel SPX3, and the second sub-pixel SPX2 may be sequentially connected in the first direction DR1 on the plane.

In FIG. 7, it has been illustrated as an example that the first sub-pixel SPX1, the second sub-pixel SPX2, and the third sub-pixel SPX3 have the same shape and their sizes may be the same. In an embodiment, in each of the pixels PX, the shape or size of any one sub-pixel among the first sub-pixel SPX1, the second sub-pixel SPX2, and the third sub-pixel SPX3 may be different on the plane.

In FIG. 7, it has been illustrated as an example that the pixels PX, the first sub-pixel SPX1, the second sub-pixel SPX2, and the third sub-pixel SPX3 may respectively have a rectangular shape on the plane. In an embodiment, the pixels PX, the first sub-pixel SPX1, the second sub-pixel SPX2, and the third sub-pixel SPX3 may respectively have at least one shape of circle, ellipse, square, parallelogram, trapezoid, or rhombus. For example, the pixels PX, the first sub-pixel SPX1, the second sub-pixel SPX2, and the third sub-pixel SPX3 may respectively have a rectangular shape, in which at least one corner is round, on the plane.

The first sub-pixel SPX1 may include a first sub-thin film transistor, a first sub-organic light-emitting device S_OEL1, and a first capacitor. The first sub-organic light-emitting device S_OEL1 may be connected to the first sub-thin film transistor. The first sub-organic light-emitting device S_OEL1 may emit light having a wavelength range of about 620 nm to about 750 nm. The first sub-organic light-emitting device S_OEL1 may emit red light. The first sub-organic light-emitting device S_OEL1 may include the first anode AN1, the first emission layer EML1, the first common emission part CMLP1, the first buffer part BLP1, the first doping part DLP1, and the first cathode part CATP1 which may be sequentially stacked in the second direction DR2 crossing the first direction DR1. The first sub-organic light-emitting device S_OEL1 may further include the first hole transport part HTRP1, the first auxiliary layer AL1, and the first electron transport region part ETRP1. The first capacitor may be connected to the first sub-thin film transistor.

The first sub-pixel SPX1 may be divided into the first light-emitting area EA1 and the first non-emitting area NEA1. The first light-emitting area EA1 may emit red light. The first light-emitting area EA1 may emit light having a wavelength range of about 620 nm to about 750 nm. On the plane, the first light-emitting area EA1, for example, may have at least one shape of circle, square, rectangle, and rhombus. On the plane, the first light-emitting area EA1, for example, may have a rectangular shape in which at least one corner is round. The first non-emitting area NEA1 may not emit light. On the plane, the first non-emitting area NEA1 may have a shape surrounding the first light-emitting area EA1.

The second sub-pixel SPX2 may include a second sub-thin film transistor, a second sub-organic light-emitting device S_OEL2, and a second capacitor. The second sub-organic light-emitting device S_OEL2 may be connected to the second sub-thin film transistor. The second sub-organic light-emitting device S_OEL2 may emit light having a wavelength range of about 495 nm to about 570 nm. The second sub-organic light-emitting device S_OEL2 may emit green light. The second sub-organic light-emitting device S_OEL2 may include the second anode AN2, the second emission layer EML2, the second common emission part CMLP2, the second buffer part BLP2, the second doping part DLP2, and the second cathode part CATP2 which may be sequentially stacked in the second direction DR2. The second sub-organic light-emitting device S_OEL2 may further include the second hole transport part HTRP2, the second auxiliary layer AL2, and the second electron transport region part ETRP2. The second capacitor may be connected to the second sub-thin film transistor.

The second sub-pixel SPX2 may be divided into the second light-emitting area EA2 and the second non-emitting area NEA2. The second light-emitting area EA2 may emit green light. The second light-emitting area EA2 may emit light having a wavelength range of about 495 nm to about 570 nm. On the plane, the second light-emitting area EA2, for example, may have at least one shape of circle, square, rectangle, and rhombus. On the plane, the second light-emitting area EA2, for example, may have a rectangular shape in which at least one corner is round. The second non-emitting area NEA2 may not emit light. On the plane, the second non-emitting area NEA2 may have a shape surrounding the second light-emitting area EA2.

The third sub-pixel SPX3 may include a third sub-thin film transistor, a third sub-organic light-emitting device S_OEL3, and a third capacitor. The third sub-organic light-emitting device S_OEL3 may be connected to the third sub-thin film transistor. The third sub-organic light-emitting device S_OEL3 may emit light having a wavelength range of about 440 nm to about 490 nm. The third sub-organic light-emitting device S_OEL3 may emit blue light. The third sub-organic light-emitting device S_OEL3 may include the third anode AN3, the third common emission part CMLP3, the third buffer part BLP3, the third doping part DLP3, and the third cathode part CATP3 which may be sequentially stacked in the second direction DR2. The third sub-organic light-emitting device S_OEL3 may further include the third hole transport part HTRP3 and the third electron transport region part ETRP3. The third capacitor may be connected to the third sub-thin film transistor.

The third sub-pixel SPX3 may be divided into the third light-emitting area EA3 and the third non-emitting area NEA3. The third light-emitting area EA3 may emit blue light. The third light-emitting area EA3 may emit light having a wavelength range of about 440 nm to about 490 nm. On the plane, the third light-emitting area EA3, for example, may have at least one shape of circle, square, rectangle, and rhombus. On the plane, the third light-emitting area EA3, for example, may have a rectangular shape in which at least one corner is round. The third non-emitting area NEA3 may not emit light. On the plane, the third non-emitting area NEA3 may have a shape surrounding the third light-emitting area EA3.

Figure 8:
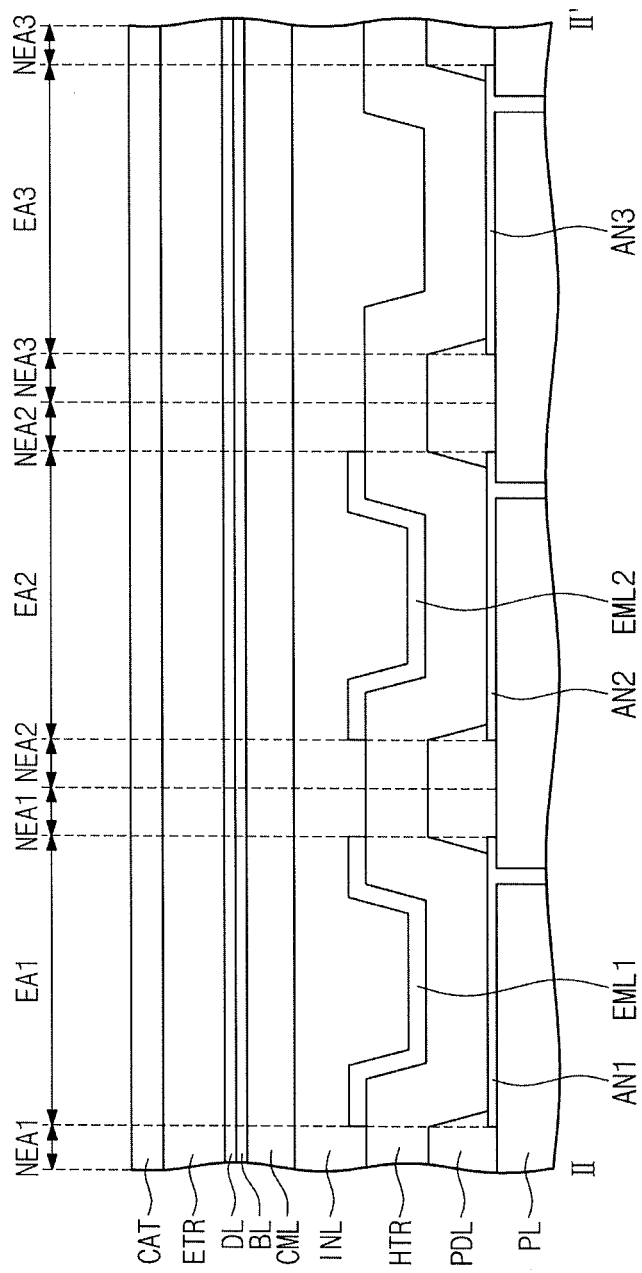
FIG. 8 illustrates a schematic cross-sectional view taken along line II-II' of FIG. 7.
Figure 9:
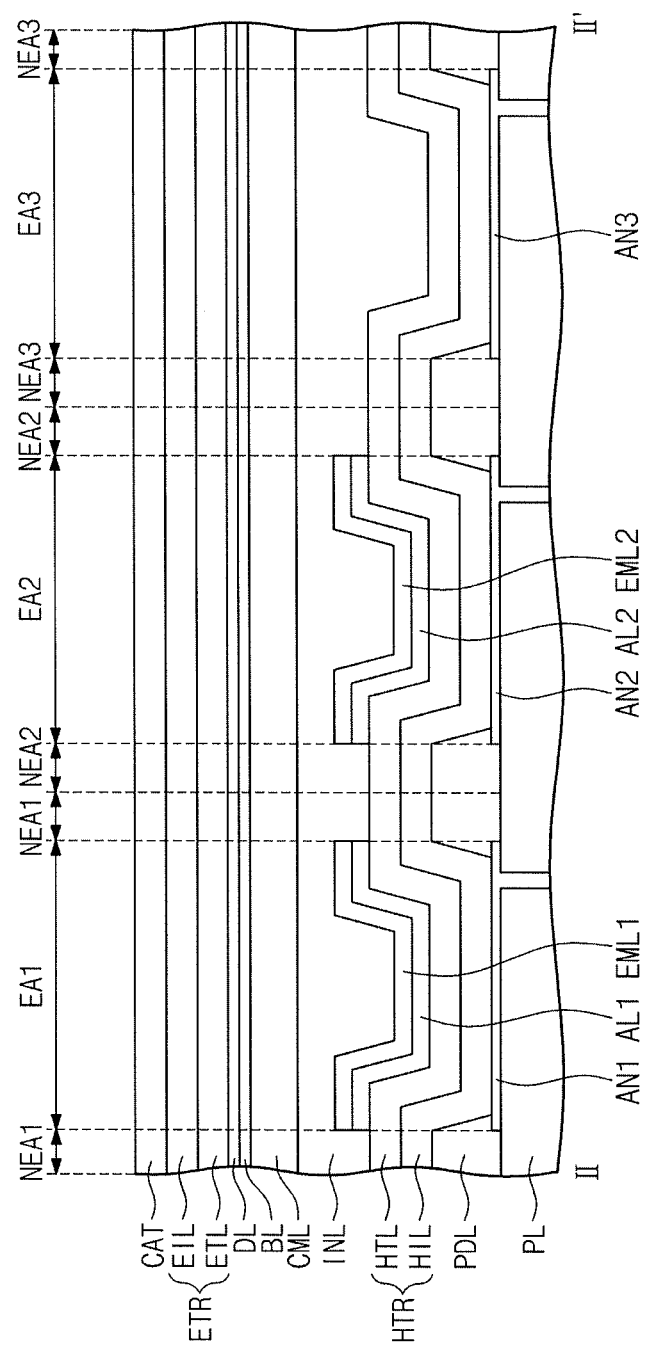
FIG. 9 illustrates a schematic cross-sectional view taken along line II-II' of FIG. 7.

FIG. 8 illustrates a schematic cross-sectional view taken along line II-II' of FIG. 7. FIG. 9 illustrates a schematic cross-sectional view taken along line II-II' of FIG. 7.

Referring to FIGS. 1, 2, 7, 8, and 9, the display apparatus according to an embodiment may include the plurality of anodes AN1, AN2, and AN3, a pixel-defining layer PDL, the hole transport region HTR, the first emission layer EML1, the second emission layer EML2, the common emission layer CML, the buffer layer BL, the doping layer DL, the electron transport region ETR, and the cathode CAT.

The first anode AN1, the second anode AN2, and the third anode AN3 may be provided on the passivation layer PL. The first anode AN1 may be provided to the first light-emitting area EA1. The second anode AN2 may be provided to the second light-emitting area EA2. The third anode AN3 may be provided to the third light-emitting area EA3.

The pixel-defining layer PDL partitioning the first light-emitting area EA1, the second light-emitting area EA2, and the third light-emitting area EA3 may be provided on the passivation layer PL. The pixel-defining layer PDL exposes a portion of a top surface of each of the first anode AN1, the second anode AN2, and the third anode AN3. The pixel-defining layer PDL may include, for example, a metal fluoride. For example, the pixel-defining layer PDL may be formed of any one metal fluoride of LiF, $BaF_2$, and CsF. The metal fluoride has insulating properties when it has a predetermined thickness. A thickness of the pixel-defining layer PDL, for example, may be in a range of about 10 nm to about 100 nm.

The hole transport region HTR may be provided on the pixel-defining layer PDL, the first anode AN1, the second anode AN2, and the third anode AN3. The hole transport region HTR may be provided on an entire area of the base substrate (BS of FIG. 6). The hole transport region HTR may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the hole transport region HTR may include the first hole transport part HTRP1, the second hole transport part HTRP2, the third hole transport part HTRP3, the fourth hole transport part HTRP4, and the fifth hole transport part HTRP5. The first hole transport part HTRP1 may be disposed in the first light-emitting area EA1. The second hole transport part HTRP2 may be disposed in the second light-emitting area EA2. The third hole transport part HTRP3 may be disposed in the third light-emitting area EA3. The fourth hole transport part HTRP4 may be disposed in the first non-emitting area NEA1 and the second non-emitting area NEA2. The fifth hole transport part HTRP5 may be disposed in the second non-emitting area NEA2 and the third non-emitting area NEA3.

The hole transport region HTR may include the hole injection layer HIL and the hole transport layer HTL. The hole injection layer HIL may include the first hole injection part HILP1, the second hole injection part HILP2, the third hole injection part HILP3, the fourth hole injection part HILP4, and the fifth hole injection part HILP5. The first hole injection part HILP1 may be disposed in the first light-emitting area EA1. The second hole injection part HILP2 may be disposed in the second light-emitting area EA2. The third hole injection part HILP3 may be disposed in the third light-emitting area EA3. The fourth hole injection part HILP4 may be disposed in the first non-emitting area NEA1 and the second non-emitting area NEA2. The fifth hole injection part HILP5 may be disposed in the second non-emitting area NEA2 and the third non-emitting area NEA3.

The hole transport layer HTL may include the first hole transport part HTLP1, the second hole transport part HTLP2, the third hole transport part HTLP3, the fourth hole transport part HTLP4, and the fifth hole transport part HTLP5. The first hole transport part HTLP1 may be disposed in the first light-emitting area EA1. The second hole transport part HTLP2 may be disposed in the second light-emitting area EA2. The third hole transport part HTLP3 may be disposed in the third light-emitting area EA3. The fourth hole transport part HTLP4 may be disposed in the first non-emitting area NEA1 and the second non-emitting area NEA2. The fifth hole transport part HTLP5 may be disposed in the second non-emitting area NEA2 and the third non-emitting area NEA3.

The first emission layer EML1 and the second emission layer EML2 may be provided on the hole transport region HTR. The first emission layer EML1 and the second emission layer EML2 may be spaced apart from each other in the first direction DR1. The first emission layer EML1 may be disposed in the first light-emitting area EA1. The first emission layer EML1 may emit light having a wavelength range of about 620 nm to about 750 nm. The second emission layer EML2 may be disposed in the second light-emitting area EA2. The second emission layer EML2 may emit light having a wavelength range of about 495 nm to about 570 nm.

Referring to FIG. 9, the first auxiliary layer AL1 and the second auxiliary layer AL2 may be provided on the hole transport region HTR. The first auxiliary layer AL1 may be provided between the first hole transport part HTRP1 and the first emission layer EML1. The first auxiliary layer AL1 may be disposed in the first light-emitting area EA1. The second auxiliary layer AL2 may be disposed in the second light-emitting area EA2.

Referring again to FIGS. 1, 2, 7, 8, and 9, the common emission layer CML may be provided on the first emission layer EML1, the second emission layer EML2, and the hole transport region HTR. The common emission layer CML may emit light having a wavelength range of about 440 nm to about 490 nm. The common emission layer CML may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the common emission layer CML may include the first common emission part CMLP1, the second common emission part CMLP2, the third common emission part CMLP3, the fourth common emission part CMLP4, and the fifth common emission part CMLP5. The first common emission part CMLP1 may be disposed in the first light-emitting area EA1. The second common emission part CMLP2 may be disposed in the second light-emitting area EA2. The third common emission part CMLP3 may be disposed in the third light-emitting area EA3. The fourth common emission part CMLP4 may be disposed in the first non-emitting area NEA1 and the second non-emitting area NEA2. The fifth common emission part CMLP5 may be disposed in the second non-emitting area NEA2 and the third non-emitting area NEA3.

The intermediate connection layer INL may be provided between the first emission layer EML1 and the common emission layer CML, between the second emission layer EML2 and the common emission layer CML, and between the hole transport layer HTR and the common emission layer CML. The intermediate connection layer INL may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

The buffer layer BL may be provided on the common emission layer CML. The buffer layer BL may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the buffer layer BL may include the first buffer part BLP1, the second buffer part BLP2, the third buffer part BLP3, the fourth buffer part BLP4, and the fifth buffer part BLP5. The first buffer part BLP1 may be disposed in the first light-emitting area EA1. The second buffer part BLP2 may be disposed in the second light-emitting area EA2. The third buffer part BLP3 may be disposed in the third light-emitting area EA3. The fourth buffer part BLP4 may be disposed in the first non-emitting area NEA1 and the second non-emitting area NEA2. The fifth buffer part BLP5 may be disposed in the second non-emitting area NEA2 and the third non-emitting area NEA3.

The doping layer DL may be provided on the buffer layer BL. The doping layer DL may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the doping layer DL may include the first doping part DLP1, the second doping part DLP2, the third doping part DLP3, the fourth doping part DLP4, and the fifth doping part DLP5. The first doping part DLP1 may be disposed in the first light-emitting area EA1. The second doping part DLP2 may be disposed in the second light-emitting area EA2. The third doping part DLP3 may be disposed in the third light-emitting area EA3. The fourth doping part DLP4 may be disposed in the first non-emitting area NEA1 and the second non-emitting area NEA2. The fifth doping part DLP5 may be disposed in the second non-emitting area NEA2 and the third non-emitting area NEA3.

The electron transport region ETR may be provided on the doping layer DL. The electron transport region ETR may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the electron transport region ETR may include the first electron transport region part ETRP1, the second electron transport region part ETRP2, the third electron transport region part ETRP3, the fourth electron transport region part ETRP4, and the fifth electron transport region part ETRP5. The first electron transport region part ETRP1 may be disposed in the first light-emitting area EA1. The second electron transport region part ETRP2 may be disposed in the second light-emitting area EA2. The third electron transport region part ETRP3 may be disposed in the third light-emitting area EA3. The fourth electron transport region part ETRP4 may be disposed in the first non-emitting area NEA1 and the second non-emitting area NEA2. The fifth electron transport region part ETRP5 may be disposed in the second non-emitting area NEA2 and the third non-emitting area NEA3.

The electron transport region ETR may include the electron transport layer ETL and the electron injection layer EIL. The electron transport layer ETL may include the first electron transport part ETLP1, the second electron transport part ETLP2, the third electron transport part ETLP3, the fourth electron transport part ETLP4, and the fifth electron transport part ETLP5. The first electron transport part ETLP1 may be disposed in the first light-emitting area EA1. The second electron transport part ETLP2 may be disposed in the second light-emitting area EA2. The third electron transport part ETLP3 may be disposed in the third light-emitting area EA3. The third electron transport part ETLP3 may be disposed in the third light-emitting area EA3. The fourth electron transport part ETLP4 may be disposed in the first non-emitting area NEA1 and the second non-emitting area NEA2. The fifth electron transport part ETLP5 may be disposed in the second non-emitting area NEA2 and the third non-emitting area NEA3.

The electron injection layer EIL may include the first electron injection part EILP1, the second electron injection part EILP2, the third electron injection part EILP3, the fourth electron injection part EILP4, and the fifth electron injection part EILP5. The first electron injection part EILP1 may be disposed in the first light-emitting area EA1. The second electron injection part EILP2 may be disposed in the second light-emitting area EA2. The third electron injection part EILP3 may be disposed in the third light-emitting area EA3. The fourth electron injection part EILP4 may be disposed in the first non-emitting area NEA1 and the second non-emitting area NEA2. The fifth electron injection part EILP5 may be disposed in the second non-emitting area NEA2 and the third non-emitting area NEA3.

The cathode CAT may be provided on the electron transport region ETR. The cathode CAT may be provided to be disposed in the first light-emitting area EA1, the first non-emitting area NEA1, the second light-emitting area EA2, the second non-emitting area NEA2, the third light-emitting area EA3, and the third non-emitting area NEA3, and may be integrated therewith.

As described above, the cathode CAT may include the first cathode part CATP1, the second cathode part CATP2, the third cathode part CATP3, the fourth cathode part CATP4, and the fifth cathode part CATP5. The first cathode part CATP1 may be disposed in the first light-emitting area EA1. The second cathode part CATP2 may be disposed in the second light-emitting area EA2. The third cathode part CATP3 may be disposed in the third light-emitting area EA3. The fourth cathode part CATP4 may be disposed in the first non-emitting area NEA1 and the second non-emitting area NEA2. The fifth cathode part CATP5 may be disposed in the second non-emitting area NEA2 and the third non-emitting area NEA3.

An organic capping layer may be provided on the cathode CAT. The organic capping layer, for example, may be provided as one body, and may be disposed in the first light-emitting area EA1, the first non-emitting area NEA1, the second light-emitting area EA2, the second non-emitting area NEA2, the third light-emitting area EA3, and the third non-emitting area NEA3.

The organic capping layer may reflect light emitted from the first emission layer EML1, the second emission layer EML2, and the common emission layer CML from a top surface of the organic capping layer toward the first emission layer EML1, the second emission layer EML2, and the common emission layer CML. The reflected light may increase luminous efficiency of the display apparatus 10 by being amplified in the organic capping layer by a resonance effect. The organic capping layer may prevent the loss of light from the cathode CAT through total internal reflection of the light in a top-emission organic light-emitting device.

The organic capping layer, for example, may include one or more of N4,N4,N4',N4'-tetra(biphenyl-4-yl)biphenyl-4,4'-diamine (TPD15), 4,4',4''-tris(carbazol-9-yl)triphenylamine (TCTA), or N,N-bis(naphthalen-1-yl)-N,N'-bis(phenyl)-2,2'-dimethylbenzidine ($\alpha$-NPD).

An encapsulation layer may be provided on the cathode CAT. The encapsulation layer may be provided as one body, and may be disposed in the first light-emitting area EA1, the first non-emitting area NEA1, the second light-emitting area EA2, the second non-emitting area NEA2, the third light-emitting area EA3, and the third non-emitting area NEA3.

The encapsulation layer may cover the cathode CAT. The encapsulation layer may include at least one layer of an organic layer and an inorganic layer. The encapsulation layer, for example, may be a thin film encapsulation layer. The encapsulation layer may protect the organic light-emitting device.

The moving speed of electrons may be lower than the moving speed of holes, and the band gap between the energy band of the hole transport region and the energy band of the first emission layer, second emission layer, and common emission layer and the band gap between the energy band of the first emission layer, second emission layer, and common emission layer and the energy band of the electron transport region may be formed. In a display apparatus, luminous efficiency may be reduced, for example, because the probability of electrons encountering holes in the first emission layer, second emission layer, and common emission layer may be low and the hole and electron injection into the first emission layer, second emission layer, and common emission layer may not be facilitated.

By way of summation and review, an organic light-emitting display may be used in displays for a mobile device, such as digital cameras, video cameras, camcorders, portable information terminals, smart phones, ultra-slim notebooks, tablet personal computers, and flexible displays, or in large electronic products or large electrical products such as ultra-thin televisions.

An organic light-emitting display may generate a color using a principle, in which holes and electrons injected from an anode and a cathode may be recombined in an emission layer to emit light, wherein light may be emitted when excitons formed by the recombination of the injected electrons and holes drop from an excited state to a ground state.

The present disclosure may provide an organic light-emitting device having high efficiency and long lifetime. The present disclosure may also provide a display apparatus having high efficiency and long lifetime.

The display apparatus according to an embodiment may include the buffer layer and the doping layer on the common emission layer, the display apparatus may reduce the band gap between the energy band of the first emission layer, second emission layer, and common emission layer and the energy band of the electron transport region, and may facilitate the electron injection into the first emission layer, second emission layer, and common emission layer. The display apparatus may prevent the holes from moving from the common emission layer to the electron transport region, the display apparatus may allow the holes to remain in the first emission layer, second emission layer, and common emission layer, and the display apparatus according to an embodiment may promote high efficiency and long lifetime.

According to an organic light-emitting device according to an embodiment, efficiency may be increased and lifetime may be extended.

According to a display apparatus according to an embodiment, efficiency may be increased and lifetime may be extended.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
   a first sub-organic light-emitting device including a first anode, a first emission layer, a first common emission layer, a first buffer layer, a first doping layer, and a first cathode layer, which are sequentially stacked;
   a second sub-organic light-emitting device including a second anode, a second emission layer, a second common emission layer, a second buffer layer, a second doping layer, and a second cathode layer, which are sequentially stacked; and
   a third sub-organic light-emitting device including a third anode, a third common emission layer, a third buffer layer, a third doping layer, and a third cathode layer, which are sequentially stacked,
   the first common emission layer, the second common emission layer, and the third common emission layer being integrated with one another as one body,
   the first buffer layer, the second buffer layer, and the third buffer layer being integrated with one another as one body,
   the first doping layer, the second doping layer, and the third doping layer being integrated with one another as one body, and
   the first cathode layer, the second cathode layer, and the third cathode layer being integrated with one another as one body, wherein:
   the first emission layer emits a first light, the second emission layer emits a second light different from the first light, and
   the first common emission layer, the second common emission layer, and the third common emission layer emit a third light different from the first light and the second light.

2. The organic light-emitting device as claimed in claim 1, wherein:
   the first emission layer emits light having a wavelength range of about 620 nm to about 750 nm,
   the second emission layer emits light having a wavelength range of about 495 nm to about 570 nm, and
   the first common emission layer, the second common emission layer, and the third common emission layer emit light having a wavelength range of about 440 nm to about 490 nm.

3. The organic light-emitting device as claimed in claim 1, wherein:
- the first sub-organic light-emitting device further includes a first hole transport region layer between the first anode and the first emission layer,
- the second sub-organic light-emitting device further includes a second hole transport region layer between the second anode and the second emission layer,
- the third sub-organic light-emitting device further includes a third hole transport region layer between the third anode and the third common emission layer, and
- the first hole transport region layer, the second hole transport region layer, and the third hole transport region layer are integrated with one another as one body.

4. The organic light-emitting device as claimed in claim 3, wherein the first sub-organic light-emitting device further includes a first auxiliary layer between the first hole transport region layer and the first emission layer.

5. The organic light-emitting device as claimed in claim 3, wherein the second sub-organic light-emitting device further includes a second auxiliary layer between the second hole transport region layer and the second emission layer.

6. The organic light-emitting device as claimed in claim 1, wherein:
- the first sub-organic light-emitting device further includes a first electron transport region layer on the first doping layer,
- the second sub-organic light-emitting device further includes a second electron transport region layer on the second doping layer,
- the third sub-organic light-emitting device further includes a third electron transport region layer on the third doping layer, and
- the first electron transport region layer, the second electron transport region layer and the third electron transport region layer are integrated with one another as one body.

7. The organic light-emitting device as claimed in claim 1, wherein the first sub-organic light-emitting device, the second sub-organic light-emitting device, and the third sub-organic light-emitting device are spaced apart from one another.

8. A display apparatus, comprising:
- a base substrate divided into a first light-emitting area, a second light-emitting area, and a third light-emitting area, which are spaced apart from one another;
- a first emission layer in the first light-emitting area;
- a second emission layer in the second light-emitting area;
- a common emission layer in the first light-emitting area, the second light-emitting area, and the third light-emitting area, the common emission layer being one body on the first emission layer and the second emission layer;
- a buffer layer in the first light-emitting area, the second light-emitting area, and the third light-emitting area, the buffer layer being one body on the common emission layer; and
- a doping layer, at least a portion of the doping layer including an n-type dopant, the doping layer being in the first light-emitting area, the second light-emitting area, and the third light-emitting area, the doping layer being one body on the buffer layer, wherein
- the common emission layer is provided between the first emission layer and the doping layer, and between the second emission layer and the doping layer.

9. The display apparatus as claimed in claim 8, wherein:
- the common emission layer is on an entire area of the base substrate,
- the buffer layer is on an entire area of the common emission layer, and
- the doping layer is on an entire area of the buffer layer.

10. The display apparatus as claimed in claim 8, wherein:
- the first light-emitting area emits light having a wavelength range of about 620 nm to about 750 nm,
- the second light-emitting area emits light having a wavelength range of about 495 nm to about 570 nm, and
- the third light-emitting area emits light having a wavelength range of about 440 nm to about 490 nm.

11. The display apparatus as claimed in claim 8, wherein:
- the first emission layer emits light having a wavelength range of about 620 nm to about 750 nm,
- the second emission layer emits light having a wavelength range of about 495 nm to about 570 nm, and
- the common emission layer emits light having a wavelength range of about 440 nm to about 490 nm.

12. The display apparatus as claimed in claim 8, further comprising a hole transport region in the first light-emitting area, the second light-emitting area, and the third light-emitting area, the hole transport region being one body between the base substrate and the common emission layer.

13. The display apparatus as claimed in claim 12, further comprising a first auxiliary layer in the first light-emitting area, the first auxiliary layer being between the hole transport region and the first emission layer.

14. The display apparatus as claimed in claim 12, further comprising a second auxiliary layer in the second light-emitting area, the second auxiliary layer being between the hole transport region and the second emission layer.

15. The display apparatus as claimed in claim 12, wherein the hole transport region includes:
- a hole injection layer on the base substrate; and
- a hole transport layer on the hole injection layer.

16. The display apparatus as claimed in claim 8, further comprising an electron transport region in the first light-emitting area, the second light-emitting area, and the third light-emitting area, the electron transport region being one body on the doping layer.

17. The display apparatus as claimed in claim 16, wherein the electron transport region includes:
- an electron transport layer on the doping layer; and
- an electron injection layer on the electron transport layer.

* * * * *